(12) United States Patent
Mongin et al.

(10) Patent No.: US 11,621,206 B2
(45) Date of Patent: Apr. 4, 2023

(54) AMPLIFIER WITH INTEGRATED TEMPERATURE SENSOR

(71) Applicant: NXP USA, Inc., Austin, TX (US)

(72) Inventors: Lionel Mongin, Chandler, AZ (US); David Paul Lester, Phoenix, AZ (US); Philippe Renaud, Chandler, AZ (US)

(73) Assignee: NXP USA, Inc., Austin, TX (US)

( * ) Notice: Subject to any disclaimer, the term of this patent is extended or adjusted under 35 U.S.C. 154(b) by 321 days.

(21) Appl. No.: 16/986,088

(22) Filed: Aug. 5, 2020

(65) Prior Publication Data

US 2022/0044982 A1 Feb. 10, 2022

(51) Int. Cl.
| | |
|---|---|
| *H03F 1/30* | (2006.01) |
| *H01L 23/34* | (2006.01) |
| *H01L 23/495* | (2006.01) |
| *H01L 23/60* | (2006.01) |
| *H01L 23/66* | (2006.01) |
| *H03F 3/213* | (2006.01) |

(52) U.S. Cl.
CPC .......... *H01L 23/34* (2013.01); *H01L 23/4952* (2013.01); *H01L 23/49503* (2013.01); *H01L 23/49562* (2013.01); *H01L 23/49568* (2013.01); *H01L 23/60* (2013.01); *H01L 23/66* (2013.01); *H03F 1/30* (2013.01); *H03F 3/213* (2013.01); *H01L 2223/665* (2013.01); *H01L 2223/6655* (2013.01); *H03F 2200/222* (2013.01); *H03F 2200/387* (2013.01); *H03F 2200/447* (2013.01); *H03F 2200/451* (2013.01)

(58) Field of Classification Search
CPC .................................... H03F 1/30; H03F 1/52
USPC .................................................. 330/289, 298
See application file for complete search history.

(56) References Cited

U.S. PATENT DOCUMENTS

| | | | |
|---|---|---|---|
| 4,760,434 A | 7/1988 | Tsuzuki et al. | |
| 5,710,519 A * | 1/1998 | McCalpin | H03F 1/302 327/482 |
| 6,906,399 B2 | 6/2005 | Fruth et al. | |
| 11,145,609 B2 * | 10/2021 | Schultz | H03F 1/0288 |
| 2022/0044982 A1 * | 2/2022 | Mongin | H01L 27/0629 |

* cited by examiner

*Primary Examiner* — Henry Choe

(57) ABSTRACT

A device includes a semiconductor die including a transistor. The transistor includes a plurality of parallel transistor elements. Each transistor element includes a drain region, a source region, and a gate region. The semiconductor die includes a first temperature sensor between a first transistor element in the plurality of transistor elements and a second transistor element in the plurality of transistor elements. The first temperature sensor is configured to generate a first output signal having a magnitude that is proportional to a temperature of the first temperature sensor.

24 Claims, 8 Drawing Sheets

AMPLIFIER WITH INTEGRATED TEMPERATURE SENSOR

TECHNICAL FIELD

Embodiments of the subject matter herein relate generally to packaged semiconductor devices, and more particularly to packaged semiconductor devices including amplifiers with integrated temperature sensing capabilities.

BACKGROUND

High power radio frequency (RF) power amplifiers are commonly used in various applications. Examples of such applications include plasma generation, laser generation, broadcasting and wireless communication applications (including satellite and cellular radio frequency communications), plasma generation, and the like. Typically, signal modulation is provided in such systems by high-power transistors that are configured to handle the signal levels required for such applications. Due to the high-power signals involved, such amplifiers may generate significant amounts of heat.

In applications in which the amplifier's input signal power level and the impedance value of the load connected to the amplifier can change quickly, the required power dissipation of the amplifier also can change quickly, resulting in rapid temperature spikes within the amplifier device. As such, the amplifiers can include thermal overload protection systems. Often these thermal protection systems rely on temperature sensors that may be attached to an external surface of the amplifier's transistor package. Although such sensors can detect increases in the transistor's temperature, such sensors are slow to react to temperature changes due to their being located some distance away from the location of heat generation within the amplifier's transistor (i.e., on the outside of the package). Consequently, conventional thermal overload protection schemes may be configured to unnecessarily inhibit high power operation of the amplifier to provide adequate thermal protection and to protect against rapid increases in device temperature.

DESCRIPTION OF THE DRAWINGS

A more complete understanding of the subject matter may be derived by referring to the detailed description and claims when considered in conjunction with the following figures:

DETAILED DESCRIPTION

Figure 1A:
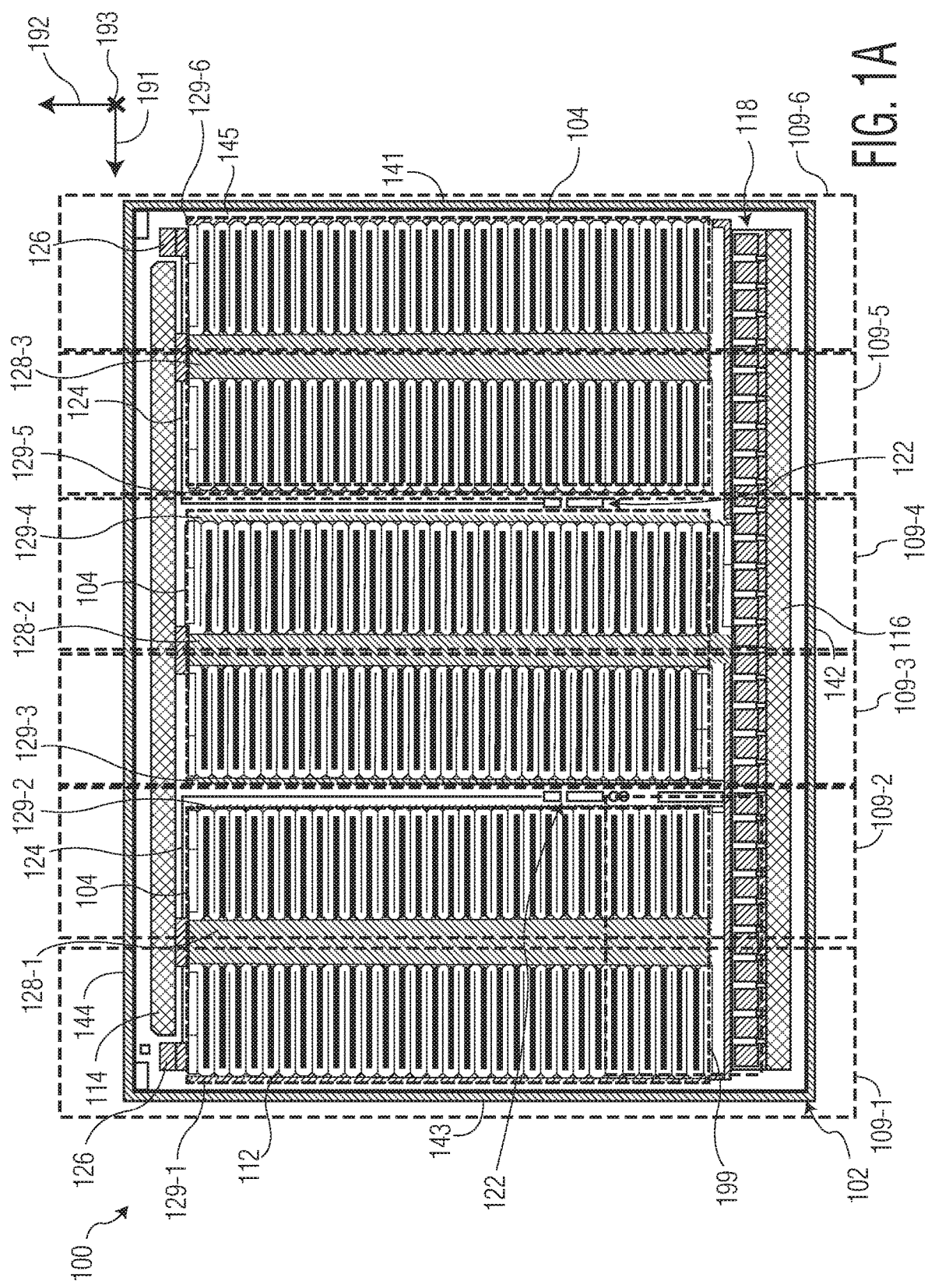
FIG. 1A illustrates a top view of an example layout of a semiconductor die including a transistor and temperature sensing elements in accordance with the present disclosure.

The present disclosure relates to improved operation of high power radio frequency (RF) amplifiers. Typical high power RF applications include plasma generation, laser generation, broadcasting and wireless communication applications (including satellite and cellular radio frequency communications), plasma generation, and the like. For some of these applications, the amplifier's input signal power level can change quickly, and the required power dissipation through the amplifier also can change quickly. For example, in cellular communication systems, some communication standards (e.g., 3G and 4G LTE (Long Term Evolution)) utilize signals that are characterized by high peak-to-average power (PAPR) levels in which signal amplitude may fluctuate by ten times or more within time slices having durations on the order of 10 milliseconds. Because processing of the high power signals called for in such applications can result in substantial heat generation, the amplifiers implement thermal overload protection schemes to prevent excessive heat build-up within the amplifier's operational transistors.

In applications in which the load presented to the amplifier is relatively consistent and the magnitude of the input signal being supplied to the amplifier is relatively consistent, the amplifier device will tend to exhibit relatively slow changes in temperature that can be accounted for by an appropriate thermal overload protection scheme. Such schemes may rely upon temperature measurements acquired by thermal sensors mounted to an exterior of a package housing the amplifier's transistor, for example.

In such amplifiers, because temperature increases occurring within the internal structure of the device's amplifier (i.e., with the device's transistors) may take some time to propagate to the exterior of the amplifier's package, such sensors may be delayed in detecting temperature increases in the device's amplifier. Because of these delays, conventional thermal overload protection schemes are typically conservative in managing thermal load of a device's amplifier. For example, conventional protection schemes may be configured to reduce the amplifier's power load upon detecting relatively small increases in amplifier temperature. While this behavior may prevent overheating, it may also prevent an amplifier from operating at high power levels that may not actually result in overheating.

Thermal management may furthermore be difficult in high power RF applications in which the amplifier's input signal or the load presented to the amplifier can change quickly (e.g., in systems utilizing 3G or 4G LTE, or other high PAPR signal protocols). In these conditions, power dissipation through the amplifier, and the resulting device temperature, can change faster than can be measured by a temperature sensor mounted to an exterior of an amplifier package. For example, in a typical use case in which a high power RF amplifier is utilized within a plasma generator, an initial load is presented to the amplifier. An RF signal is supplied through the amplifier to generate an RF field at the output of the plasma generator. As the power of the RF signal increases, eventually plasma is generated at the output, which greatly changes the load impedance presented to the device's amplifier. This can cause a rapid increase in temperature within the device's amplifier.

In the present amplifier device, a temperature sensor is incorporated directly into the semiconductor die that contains the device's transistors. The temperature sensor is configured to generate an output voltage that can be correlated to or is proportional to a particular sensed temperature, and the sensor outputs that voltage at a contact pad on a surface of the semiconductor die. The contact pad may be coupled to a device controller, which can control the operation of the device's amplifier based upon the sensed temperature (i.e., the voltage outputted by the temperature sensor at the contact pad).

In various embodiments, the amplifier's transistor die may be implemented with a number of parallel-arranged, elongated, narrow transistor "fingers," each of which include elongated source, drain, and gate regions. The transistor fingers may be positioned in parallel within the amplifier die in the semiconductor die's active region. As described herein, and illustrated in FIGS. 1A and 4, in accordance with the present disclosure, one or more temperature sensors may be positioned between different transistor fingers within a single transistor die. So positioned, the temperature sensors can provide very low latency measurements of the amplifier's transistor die, and specifically the active region of the transistor die. Additionally, because the peaks of heat generated by the device's amplifier will be detectable at those specific locations (i.e., between transistor elements—essentially within the active region itself rather than outside a periphery of the active region) the present temperature sensors can provide accurate measurements of the amplifier's hottest regions with minimal delay—in some embodiments, temperature changes within the transistor may be detected within tens of microseconds. Conventional approaches in which a temperature sensor is mounted to an exterior of the amplifier package may not being configured to detect temperature changes as quickly.

By integrating the temperature sensors into the same semiconductor die in which the amplifier device's transistors are implemented, and more specifically within an interior region of the active region of the semiconductor die, delays in temperature sensing are minimized. As a result, temperature measurements track the temperature of the active transistor elements more closely than conventional approaches. This enables higher power and more reliable operation because thermal protection circuitry can quickly react to thermal overloads.

Figure 1B:
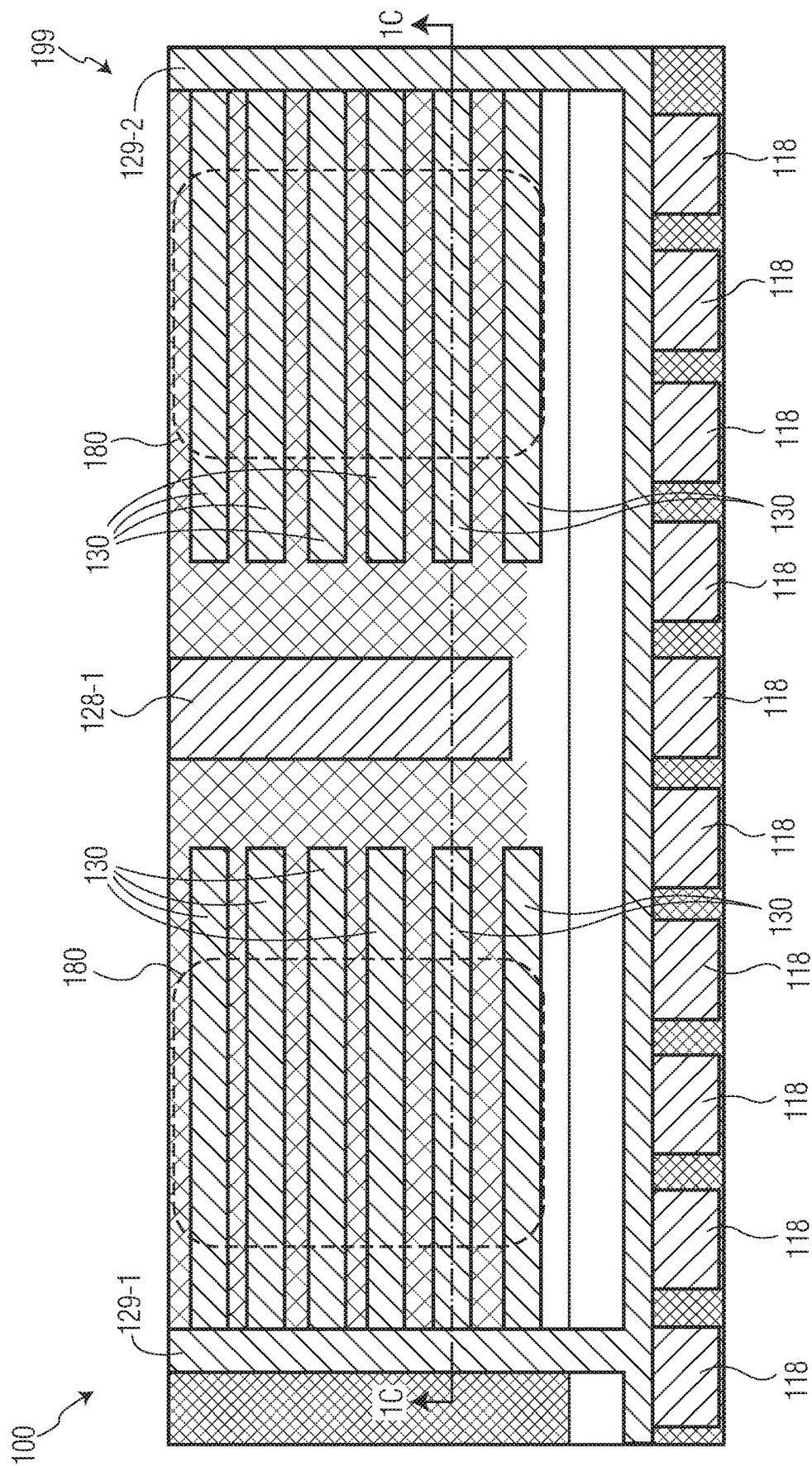
FIG. 1B is an enlarged top view of a portion of the die of FIG. 1.
Figure 1C:
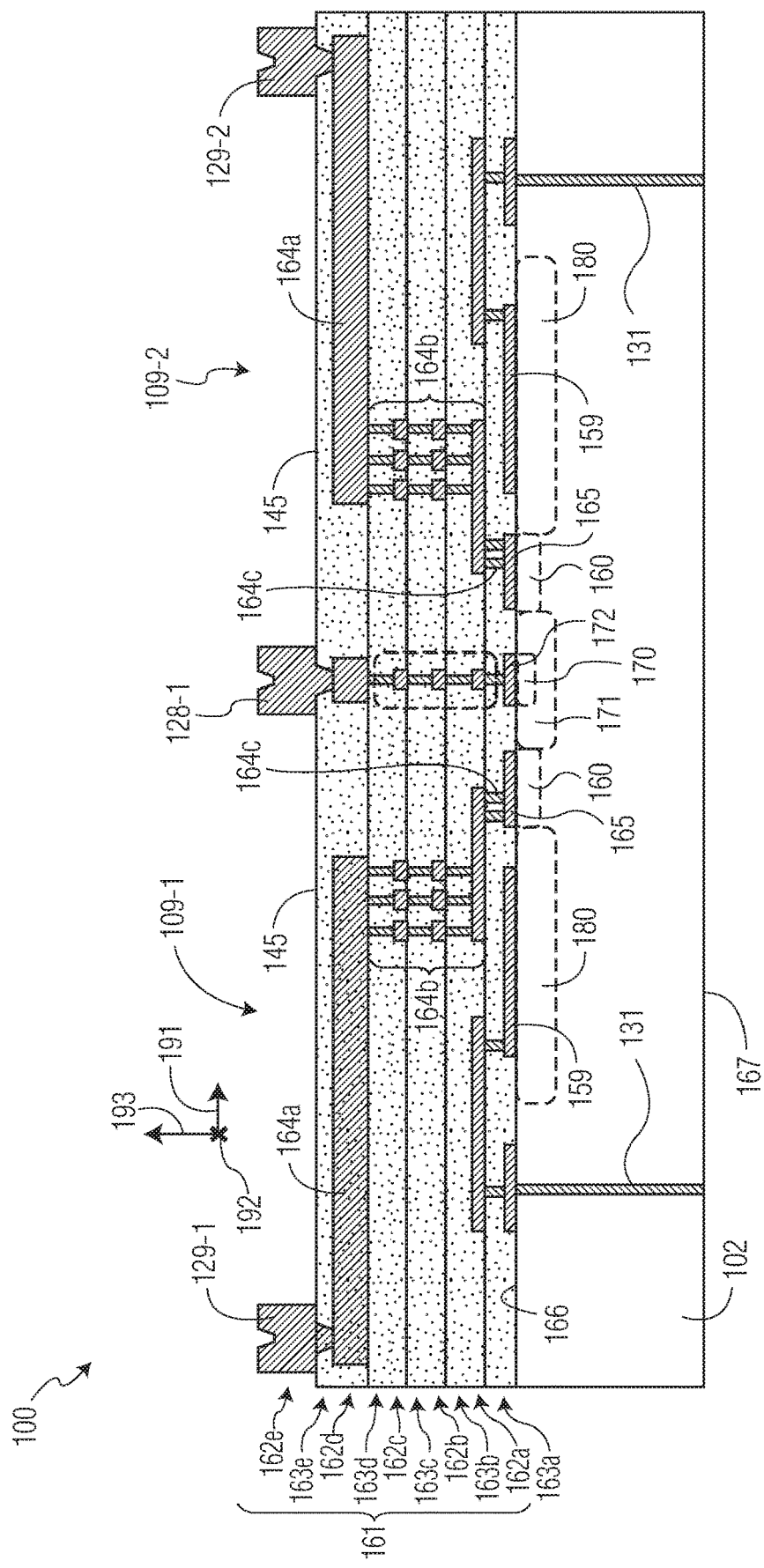
FIG. 1C is a cross-sectional view taken along line 1C-1C of FIG. 1B.

FIG. 1A illustrates a top view of an example layout of a semiconductor die 100 including a power transistor and temperature sensing elements in accordance with the present disclosure. FIG. 1B is an enlarged top view of a portion 199 of die 100 of FIG. 1A. FIG. 1C is a cross-sectional view taken along line 1C-1C of FIG. 1B. Although FIGS. 1A and 1B depict top views of the die 100, it should be noted that some of the features shown in FIGS. 1A and 1B may be located in material layers underlying the top surface of die 100. Thus, such features actually may be hidden in an actual top view. However, for clarity of description and enhanced understanding, features that otherwise may be hidden are depicted in FIGS. 1A and 1B.

Orthogonal coordinate axes 191, 192, and 193 are included in FIGS. 1A and 1C to clarify the orientations of various features. The terms "vertical," "vertically," and "vertical direction," as used herein, mean a direction parallel to axis 193, or perpendicular to the top surface of the die 100. Conversely, the terms "horizontal," "horizontally," and "horizontal direction," as used herein, mean a direction parallel to axes 191 and 192, or parallel to the surface of the die 100.

Die 100 has a top surface 145, a bottom surface 167, and sides 141, 142, 143, 144 extending between the top and bottom surfaces 145, 167. Die 100 includes a semiconductor substrate 102 and a build-up structure 161 coupled to a top surface 166 of the semiconductor substrate 102. An active area 104 is defined within and over the semiconductor substrate 102. Transistor 106 is formed over and integrated into active area 104 of die 100. FIG. 1A provides one example layout and implementation of transistor 106, but it should be understood that transistor 106 may include any desired type of transistor, including a bipolar junction transistor (BJT) or a laterally-diffused metal-oxide semiconductor (LDMOS) transistor, or another type of field effect transistor. Transistor 106 can be a high-power transistor and may be configured to handle power load of 1.5 or 2 kilowatts. However, in other embodiments, transistor 106 may be configured to handle more or less power. For example, in some applications, transistor 106 may be configured to handle power loads of 100 watts or less. In general, depending on the application, transistor 106 may be configured to handle a great variety of power loads.

Referring to FIG. 1A and FIG. 1C, transistor 106 is formed within active area 104 (indicated by the dashed boxes) of die 100. As used herein, the "active area" of a die is defined as a three dimensional area between top and bottom die surfaces, which includes doped semiconductor regions and conductive structures that function as transistor elements or "fingers". According to an embodiment, transistor elements within the active area are coupled in parallel with each other between a common input terminal (e.g., gate terminal 116) and a common output terminal (e.g., drain terminal 114). For example, active area 104 shown in FIG. 1C includes six transistor fingers arranged in parallel between the gate and drain terminals 116, 114. In other embodiments, some or all of the transistor fingers may be coupled to separate input and/or output terminals, where the separate terminals are externally electrically coupled together (e.g., using wirebonds and/or other conductive connections).

As mentioned above, die 100 includes a semiconductor substrate 102 with top and bottom surfaces 166, 167. Transistor die 100 also includes a build-up structure 161 formed over the top surface 166 of the substrate 102, where the exterior surface of the build-up structure 161 corresponds to the top surface of the transistor die 100. In various embodiments, the semiconductor substrate 102 may comprise silicon, silicon-on-insulator (SOI), silicon-on-sapphire (SOS), gallium arsenide (GaAs), gallium nitride (GaN), GaN on silicon carbide, GaN on silicon, or other types of substrate materials. For example, the substrate 102 may have a thickness in a range of about 50 microns to about 100 microns (e.g., about 75 microns), although the substrate 102 may be thinner or thicker, as well. The substrate 102 may include, for example, a base semiconductor substrate and one or more additional semiconductor layers epitaxially formed on the surface of the base semiconductor substrate. In a particular example embodiment, the substrate 102 is a high-resistivity silicon substrate (e.g., a silicon substrate having bulk resistivity in a range of about 1000 ohm-centimeter (cm) to about 100,000 ohm-cm or greater). Alternatively, the substrate 102 may be a semi-insulating GaAs substrate (e.g., a GaAs substrate having bulk resistivity up to $10^8$ ohm-cm), or another suitable high-resistivity substrate. In such embodiments, electrical connections between the top and bottom substrate surfaces 166, 167 may be made using conductive through substrate vias (TSVs) (e.g., TSV 131, FIG. 1C). Alternatively, electrical connections between top and bottom substrate surfaces 166, 167 may be made using wrap-around terminations or using other conductive structures. Still other embodiments may be implemented using low-resistivity substrates.

Build-up structure 161 includes an alternating arrangement of a plurality of patterned conductive layers 162a-162e and a plurality of dielectric layers 163a-163e, each of which is formed over and coupled to the top substrate surface 166. The exposed surface of the top layer of the build-up structure 161 corresponds to the top surface 145 of the die 100. For example, using nomenclature known in the semiconductor device manufacturing arts, the patterned conductive layer 162a closest to the top substrate surface 166 may correspond to the M1 layer (metal 1 layer), and the conductive layers 162b-162e located sequentially farther from the top substrate surface 166 may correspond to the M2, M3, M4, and M5 layers, respectively. Conductive vias extend through the dielectric layers 163a-163e to provide for electrical connection between the conductive layers 162a-162e, and to provide for electrical connection to conductive structures in electrical communication with doped semiconductor regions (e.g., drain region 170, channel region 160, and source region 180).

Although particular example materials and dimensional ranges are listed herein, the semiconductor substrate 102 and layers 163a-163e may be formed from different materials than the above-listed materials, and/or may have larger or smaller thicknesses than the above-given ranges, in other embodiments. In addition, although an example embodiment is described herein with five metal layers 163a-163e (e.g., M1-M5), a device may have more or fewer metal layers, as well. For example, an alternate embodiment may include build-up structures with as few as two metal layers (e.g., M1-M2), or some other number of layers.

Referring to FIGS. 1A and 1B, transistor 106 includes a plurality of transistor "finger" elements 109-1 through 109-6 (also referred to as active elements or transistor fingers) (collectively referred to as transistor fingers 109) where each finger element includes a conductive drain runner 128-1, 128-2, 128-3 (collectively drain runners 128) and a conductive gate runner 129-1 through 129-6 (collectively gate runners 129) each of which is elongated in a direction that extends between sides 142 and 144 (i.e., parallel to axis 192). In the device illustrated in FIGS. 1A-1C, sets of adjacent transistor fingers 109 share a common drain runner 128, but each finger 109 has its own gate runner 129. For example, a first set of fingers 109-1 and 109-2 share a first common drain runner 128-1, a second set of fingers 109-3 and 109-4 share a second common drain runner 128-2, and a third set of fingers 109-5 and 109-6 share a third common drain runner 128-3.

Within each transistor finger, a plurality of conductive gate contact features, referred to herein as gate "taps" 130, extend perpendicular from each gate runner 129 to a gate contact (e.g., contact 165, FIG. 1C). Although only six transistor finger elements 109 are illustrated in FIG. 1A, a transistor die may include more or fewer fingers 109, in other embodiments. Generally, the number of transistor fingers 109 may be as few as 2 fingers to as many as 50 fingers, although a device may have fewer or more fingers, as well.

In any event, each transistor finger 109-1 through 109-6 includes:

a) a first current-carrying region 170 (e.g., a drain region) in the form of an elongated first doped semiconductor region at and below the top surface 166 of the semiconductor substrate 102, where region 170 is elongated in a direction parallel to axis 192. For example, region 170 may have a width (i.e., dimension parallel to axis 191) in a range of about 2 microns to about 4 microns (e.g., about 3 microns), although region 170 may have a smaller or larger width, as well;

b) a drift region 171 in which the first current-carrying region 170 is implanted, wherein the drift region 171 is at and below the top surface 166 of the semiconductor substrate 102, and region 171 is elongated in a direction parallel to axis 192. For example, region 171 may have a width (dimension between regions 160 and 170) in a range of about 1.0 microns to about 10.0 microns, although region 171 may have a smaller or larger width, as well;

c) a second current-carrying region 180 (e.g., a source region) in the form of an elongated second doped semiconductor region at and below the top surface 166 of the semiconductor substrate 102, where region 180 is elongated in a direction parallel to axis 192. For example, region 180 may have a width (i.e., dimension parallel to axis 192) in a range of about 5.0 microns to about 50 microns, although region 180 may have a smaller or larger width, as well;

d) a channel region 160 in the form of an elongated third semiconductor region at and below the top surface 166 of the semiconductor substrate 102 between the drift region 171 and the second current-carrying region 180, and where region 160 is elongated in a direction parallel to axis 192. For example, region 160 may have a width (i.e., dimension parallel to axis 191) in a range of about 0.1 microns to about 1.0 microns, although region 160 may have a smaller or larger width, as well;

e) a first current-carrying terminal (e.g., a drain terminal), which is electrically connected to the drain runner 128 and to the first current-carrying region 170, and which is formed from a first assembly of conductive features of the build-up structure 161;

f) a second current-carrying terminal (e.g., a source terminal), which is electrically connected to the second current-carrying region 180, and which is electrically connected to a TSV 131 that extends from the top surface 166 to the bottom surface 167 of the semiconductor substrate 102; and g) a control terminal (e.g., a gate terminal or gate region), which is electrically connected between the gate runner 129 and the channel region 160, and which includes a plurality of conductive features 164a-164c and 165 of the build-up structure 161 (conductive feature 164a may be equivalent to the gate tap 130).

The lengths of the fingers 109 (i.e., dimension parallel to axis 192), and thus the lengths of each of the channel region 160, drain region 170, drift region 171, and source region 180 may be in the range of about 100 microns to about 2000 microns (e.g., about 500 microns), although the fingers 109 may be shorter or longer, as well.

As most clearly depicted in FIG. 1A, the control terminal of each finger 109 includes an elongated conductive runner 129 (referred to herein as a "gate runner"), which extends parallel to axis 192 between a proximal end and a distal end. A plurality of conductive structures, referred to as "gate taps" 130 extend from the gate runner 129 toward and to the channel region. Each gate runner 129 is coupled to and extends from gate terminal 116 (also referred to as a control terminal) across the channel region so that voltages applied to the gate terminal 116 during operation may modulate the conductivity of the channels, and thus the current flow between source regions 180 and drain regions 170. In some embodiments, electrostatic discharge (ESD) devices 118 may be coupled between gate terminal 116 and the gate structures 112, including gate runners 129 and gate taps 130 (see FIG. 1B).

The first current-carrying terminal of each finger 109 includes an elongated conductive runner 128 (referred to herein as a "drain runner"), extends to and connects to drain terminal 114, which serves as an output terminal of transistor 106. Each drain runner 128 extends parallel to axis 192 between a proximal end (which is coupled to drain terminal 114) and a distal end (which is electrically floating).

Each drain runner 128 is electrically connected to the drain region 170 through a plurality of conductive structures (e.g., conductive drain pillars) and a drain region contact 172. As illustrated in FIG. 1C, each drain pillar includes a plurality of conductive vias and portions of metal layers 162a-162e, which are arranged in a stack that extends vertically from the drain runner 128 toward the drain region 170. The drain region contact 172 electrically couples each the drain pillar to the drain region 170.

As indicated in FIG. 1C, the gate and drain runners 129, 128 may be formed from portions of one or more relatively high metal layers (e.g., M4 and/or M5 layers 162d, 162e). The gate and drain terminals 116, 114 also may be formed from portions of one or more relatively high metal layers (e.g., M4 and/or M5 layers 162d, 162e). According to an embodiment, the gate terminal 116 and the drain terminal 114 may be exposed at the top surface 145 of the transistor die 100, and are configured for attachment of bond wires. Accordingly, during operation of transistor 106, an input signal may be provided by external circuitry to gate terminal 116, and a resulting amplified output RF signal may be produced by the transistor die 100 at drain terminal 114 for transmission to external circuitry.

The source region 180 may be electrically coupled to a ground reference. As best shown in FIG. 1C, this may be achieved using one or more source contacts 159 and additional conductive features of the build-up structure 161, which are electrically coupled to through substrate vias (e.g., TSV 131) or doped sinker regions (not illustrated) that electrically connect the source region 180 to the bottom surface 167 of the die 100. When the die 100 is incorporated into a packaged device or other system (e.g., device 400, FIG. 4), a conductive layer (not shown) on the bottom surface 167 of the die may be coupled to the conductive top surface of a substrate, and that substrate in turn may be grounded. In an alternate embodiment, rather than being electrically coupled to the bottom surface 167 of the die 100, the source contacts may be electrically connected to one or more conductive source terminals (not illustrated) that are exposed at the top surface 145 of the die. In such an embodiment, the die 100 may be utilized as a "flip chip", which may be inverted (from the perspective of FIG. 1C), and the gate, drain, and source terminals all may be connected to corresponding contacts on a system substrate.

Although a particular layout of an LDMOS FET is illustrated in FIGS. 1A-1C, it should be understood that many different layouts may be implemented to provide the transistor(s), in various embodiments. Numerous other modifications also may be made, depending on the characteristics of the selected substrate and the operation and performance of the transistor. For instances in which transistor 106 is a BJT transistor, gate terminal 116 will be instead be a base terminal, the source terminal will instead be an emitter terminal, and drain terminal 114 will instead be a collector terminal.

In the arrangement depicted in FIGS. 1A-1C, the various interdigitated fingers 109 of transistor 106 are arranged in parallel within the active area 104 of semiconductor die 100. Temperature sensors 122 are formed within and integrated into die 100 between the interdigitated active elements or fingers 109 (i.e., within the active area 104 of die 100 in which the fingers 109 of transistor 106 are formed). In this configuration, accordingly, adjacent transistor fingers 109 (e.g., fingers 109 that are coupled to the same drain and gate terminals 114, 116) are located on both sides of each temperature sensor 122. Furthermore, because temperature sensors 122 are located towards a central region of transistor 106 and die 100, temperature sensors 122, as shown in FIG. 1A, are also located between control terminal 116 and output terminal 114 of transistor 106. In embodiments, temperature sensors 122 may be formed in the build-up structure 161 of die 100.

In general, temperature sensors 122 may be implemented as any circuit components suitable for forming in semiconductor die 100 and are configured to generate an output voltage that is dependent on or proportional to measured temperature. Temperature sensors 122 may be implemented using a diode or a number of series-connected diodes formed in die 100 and are generally configured to generate an output voltage signal that is indicative of sensed temperature when a constant current is supplied to temperature sensors 122. In embodiments in which temperature sensors 122 are implemented using series-connected diodes, the output voltage of the temperature sensors 122 changes at a known rate as temperature changes given a constant current input (e.g., minus approximately 2 mV per degree Celsius). As such, with a constant input current, the voltage value output by or across temperature sensors 122 can be used to determine the temperature of the temperature sensors 122.

By positioning temperature sensors 122 between the transistor elements (e.g., transistor fingers 109) of transistor 106, temperature sensors 122 are exposed to the region of transistor 106 in which the most heat will be generated during operation. This enables temperature sensors 122 to measure a current operational temperature of transistor 106, which can be utilized to implement optimized thermal control, as described herein.

Figure 5:
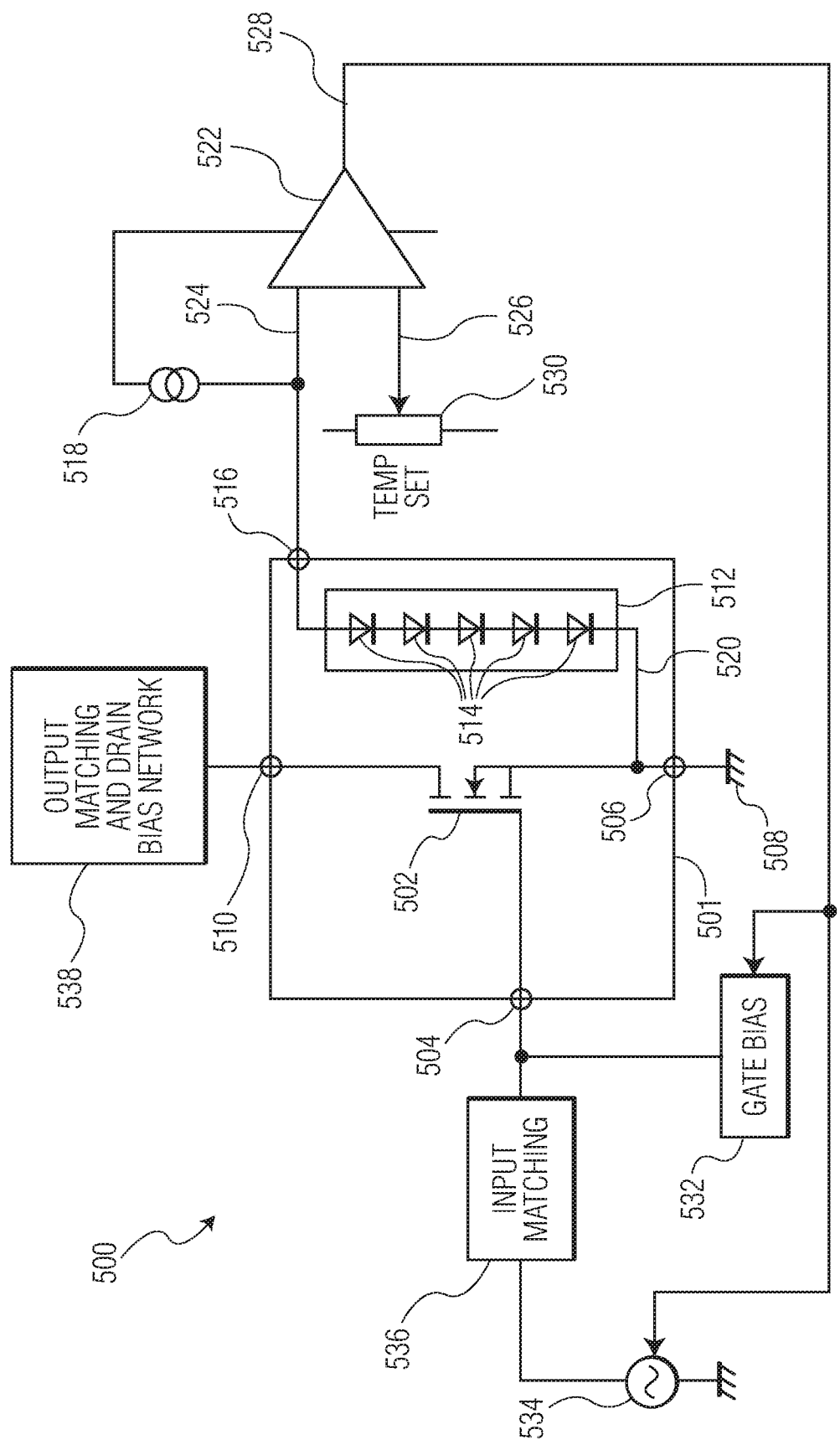
FIGS. 5 and 6 are block diagrams depicting components of control systems configured to monitor an on-die temperature sensor, where the temperature sensors are configured to measure temperatures indicative of an operational temperature of a high-power transistor.
Figure 6:
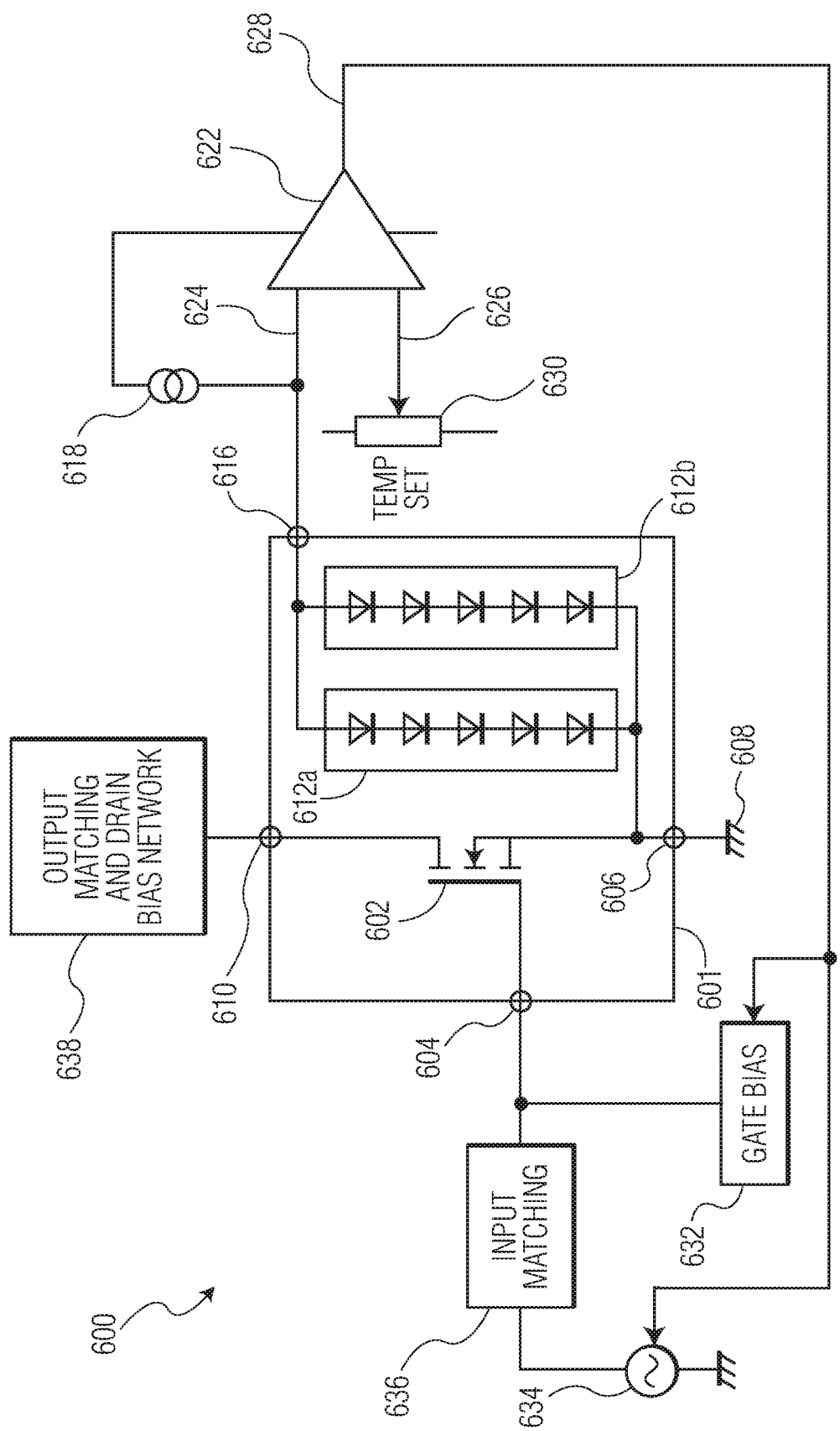

The voltage generated by temperature sensors 122 is communicated via traces 124 to temperature sensor contact pads 126. External circuit components (i.e., a device controller) can be connected to temperature sensor contact pads 126 to receive the voltage generated by temperature sensors 122, convert that voltage value into a temperature value (or compare the voltage value to threshold voltage values), and take appropriate action. An example of such controller components is illustrated in FIGS. 5 and 6 and described below. Although traces 124 may generally be formed over a surface of die 100 or in an internal conductive layer of the build-up structure 161, traces 124 are configured to run underneath and not come into contact with drain finger contacts 128.

Figure 2:
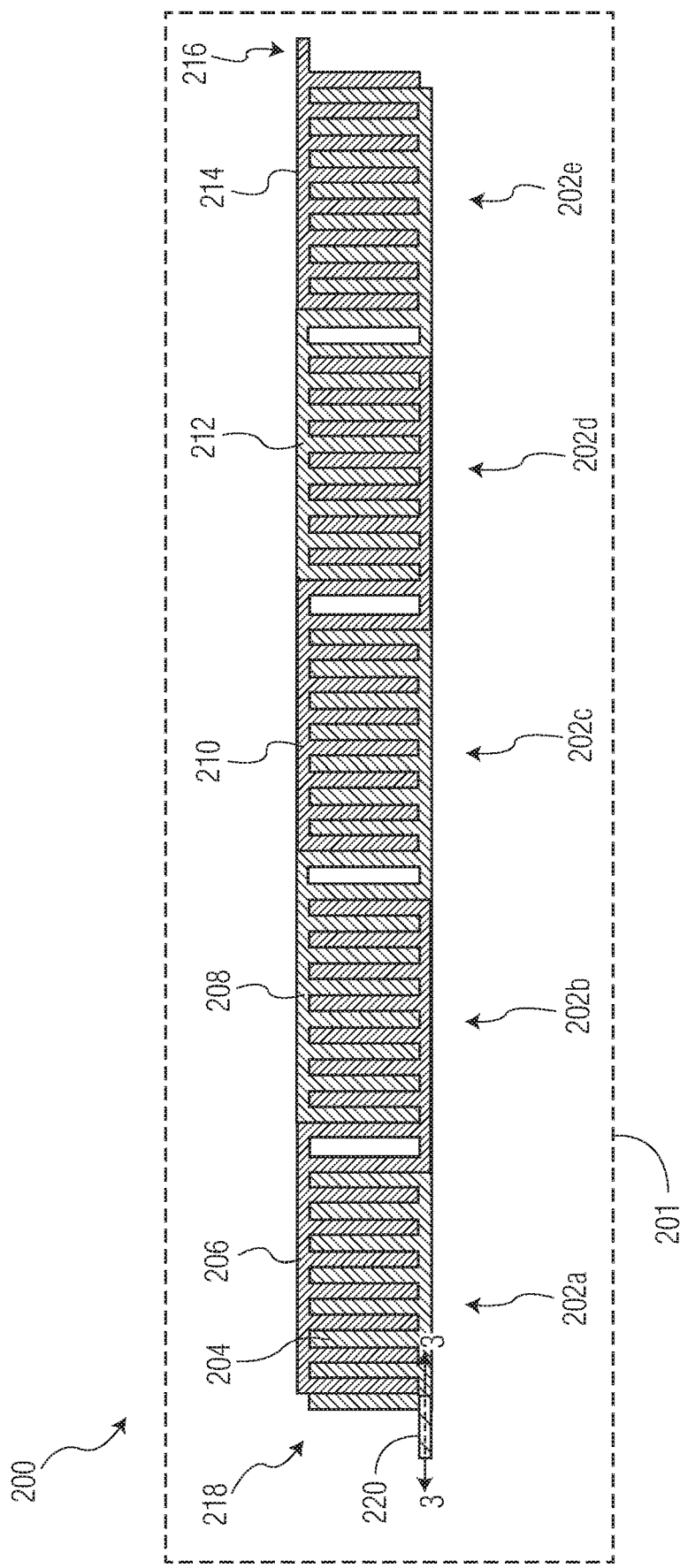
FIG. 2 illustrates aspects of a temperature sensor that may be incorporated into the device illustrated in FIG. 1.

FIG. 2 illustrates aspects of a temperature sensor that may be incorporated into the device illustrated in FIG. 1. FIG. 2 is a top view of temperature sensor 200. Specifically, temperature sensor 200 may be formed over a semiconductor substrate between transistor elements of a transistor.

Temperature sensor 200 (e.g., temperature sensor 122, FIG. 1) includes series-connected diodes 202a-202d integrally formed over a substrate 201 (e.g., substrate 102 of FIGS. 1A-1C). In an embodiment (e.g., where temperature sensor 200 is integrated within a semiconductor device such as die 100 of FIG. 1), a top surface of substrate 201 may include a layer of insulative material such as silicon dioxide ($SiO_2$). In other embodiments, temperature sensor 200 may be formed within a build-up structure located over a top surface of die 100 (e.g., within layers 161 as illustrated in FIG. 1C). Each diode 202 is formed from a junction of n-type and p-type polysilicon materials that could be formed over or within a surface of substrate 201. Specifically, diode 202a includes a junction formed by n-type polysilicon material 204 and p-type polysilicon material 206. Diode 202b includes a junction formed by p-type polysilicon material 206 and n-type polysilicon material 208. Diode 202c includes a junction formed by n-type polysilicon material 208 and p-type polysilicon material 210. Diode 202d includes a junction formed by p-type polysilicon material 210 and n-type polysilicon material 212. Diode 202e includes a junction formed by n-type polysilicon material 212 and p-type polysilicon material 214.

In the example depicted in FIG. 2, the junctions implemented within each diode 202 is formed by interdigitated fingers of each of the n-type and p-type materials making up each junction. This arrangement can, in some embodiments, enable a high forward current in the diodes (e.g., a current of several hundreds of milliamps) that can increase device robustness. In other embodiments of temperature sensor 200, however, different diode configurations in which the junction of each diode is a conventional plane with no interdigitation may be utilized.

A first end 216 of temperature sensor 200 may be connected via a conductive trace, bond wire, or other conductive structure to a contact pad (e.g., temperature sensor contact pad 126) that may be coupled to one or more external components enabling those components to read a voltage output by temperature sensor 200.

Figure 3:
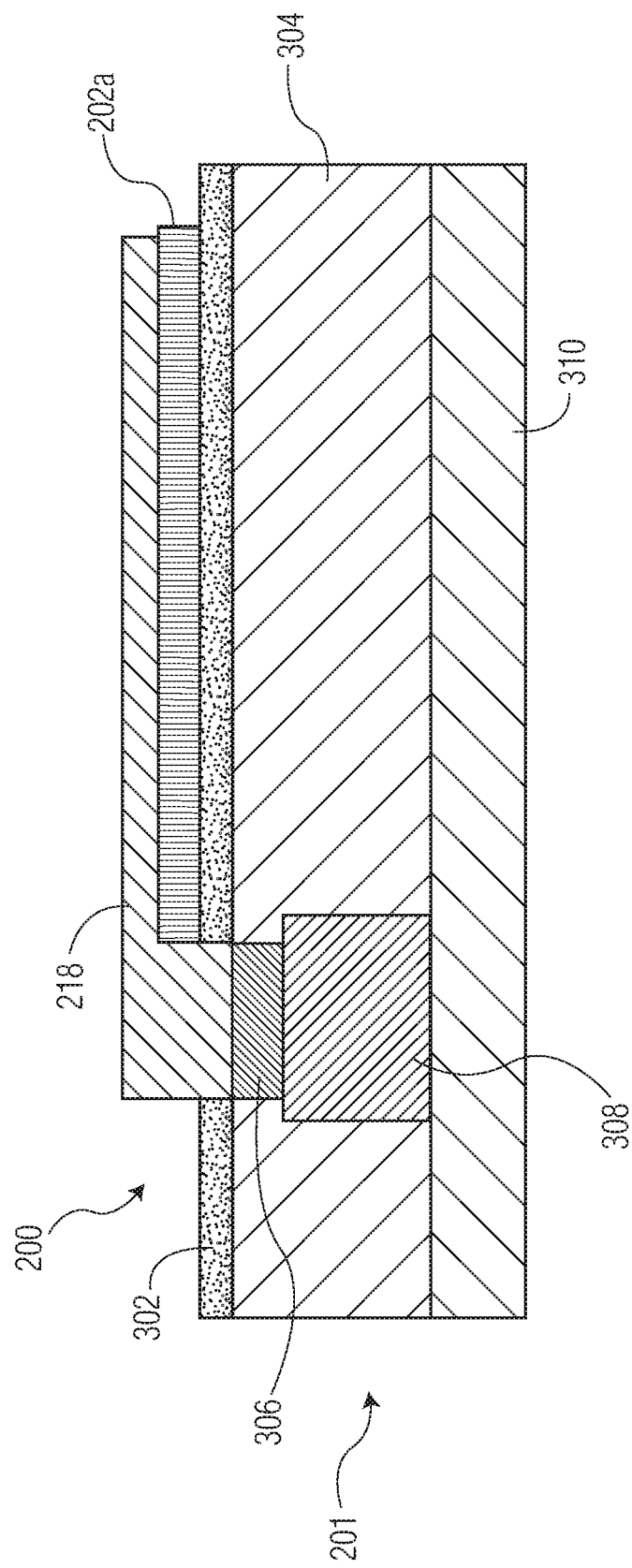
FIG. 3 is a cross-sectional view of a portion of the temperature sensor of FIG. 2 taken along line 3-3 of FIG. 2.

The second end 218 of temperature sensor 200 may be connected to a ground terminal via a metal trace 220. In an embodiment, the second end 218 of temperature sensor 200 may be connected to a ground potential node located on or in a back surface of substrate 201. To illustrate this potential configuration, FIG. 3 is a cross-sectional view of a portion of temperature sensor 200 taken along line 3-3 of FIG. 2. FIG. 3 illustrates the connection between the second end 218 of temperature sensors 200 and a ground potential node on a back side of substrate 201.

As illustrated, metal trace 220 is formed over and in contact with a portion of polysilicon diode 202a and substrate 201. Substrate 201 includes a top layer of silicon dioxide 302.

Below the top layer of silicon dioxide 302, substrate 201 includes epi layer 304, which may be n– or p– type. Within epi layer 304 a doped contact region 306 and sinker region 308 are formed. Doped contact region 306 and sinker region 308 are of the same doping type (e.g., n– or p– type) as the surrounding epi layer 304. If epi layer 304 is a p-type epi layer, contact region 306 may be a p+ contact region, while sinker region 308 may be a p– sinker region. Conversely, if epi layer 304 is an n-type epi layer, contact region 306 may be an n+ contact region, while sinker region 308 may be an n– sinker region. Doped contact region 306 and sinker region 308 are in contact with one another or may overlap and, taken together, extend across the depth of epi region 304. Consequently, doped contact region 306 and sinker region 308 form a conductive channel through epi layer 304. In this description, various regions of the cross section shown in FIG. 3 may be identified as being of N type or P type for convenience of description and not intended to be limiting, and such identification may be replaced by the more general description of being of a "first conductivity type" or a "second, opposite conductivity type" where the first type may be either N or P type and the second type then is either P or N type.

An opening is formed in silicon dioxide layer 302 and metal trace 220 is placed into physical contact with doped contract region 306 through the opening. The opening may be formed in silicon dioxide layer 302 (e.g., via etching) after silicon dioxide layer 302 is formed. Or, alternatively, silicon dioxide layer 302 may be formed so as to define or include the opening at the time silicon dioxide layer 302 is formed.

Beneath epi layer 304, layer 310 of substrate 201 includes a doped region of the same type as epi layer 304. Layer 310 forms a conductive layer that may be coupled to a ground potential node potential. Layer 310 is connected to metal trace 220 (and, consequently, second end 218 of temperature sensor 200) through doped sinker region 308, and doped contact region 306 so that layer 310 can act a ground node for temperature sensor 200.

Returning to FIG. 2, when utilizing temperature sensor 200, a constant current source is coupled to the first end 216 to pass a constant current through temperature sensor 200 to second end 218 and the connected ground potential node. A voltage drop is observed across the junctions of each of diodes 202a-202e so, in response to the constant current, temperature sensor 200 generates a voltage output at the first end 216. That output voltage can then be communicated to a connected contact pad. Because the voltage across each diode 202a-202e is temperature dependent, it is possible to determine a temperature of temperature sensor 200 based upon the voltage generated by temperature sensor 200 at first end 216. The use of several diodes 202a-202e in series in temperature sensor 200 can increase the temperature sensor 200 sensitivity. The direct bias threshold voltage of such a sensor 200 is the threshold voltage of a single diode 202 multiplied by the number of diodes 202 connected in series. As such, the sensor 200 sensitivity to temperature (i.e., Vt variation with temperature) can be enhanced by the same magnitude.

Figure 4:
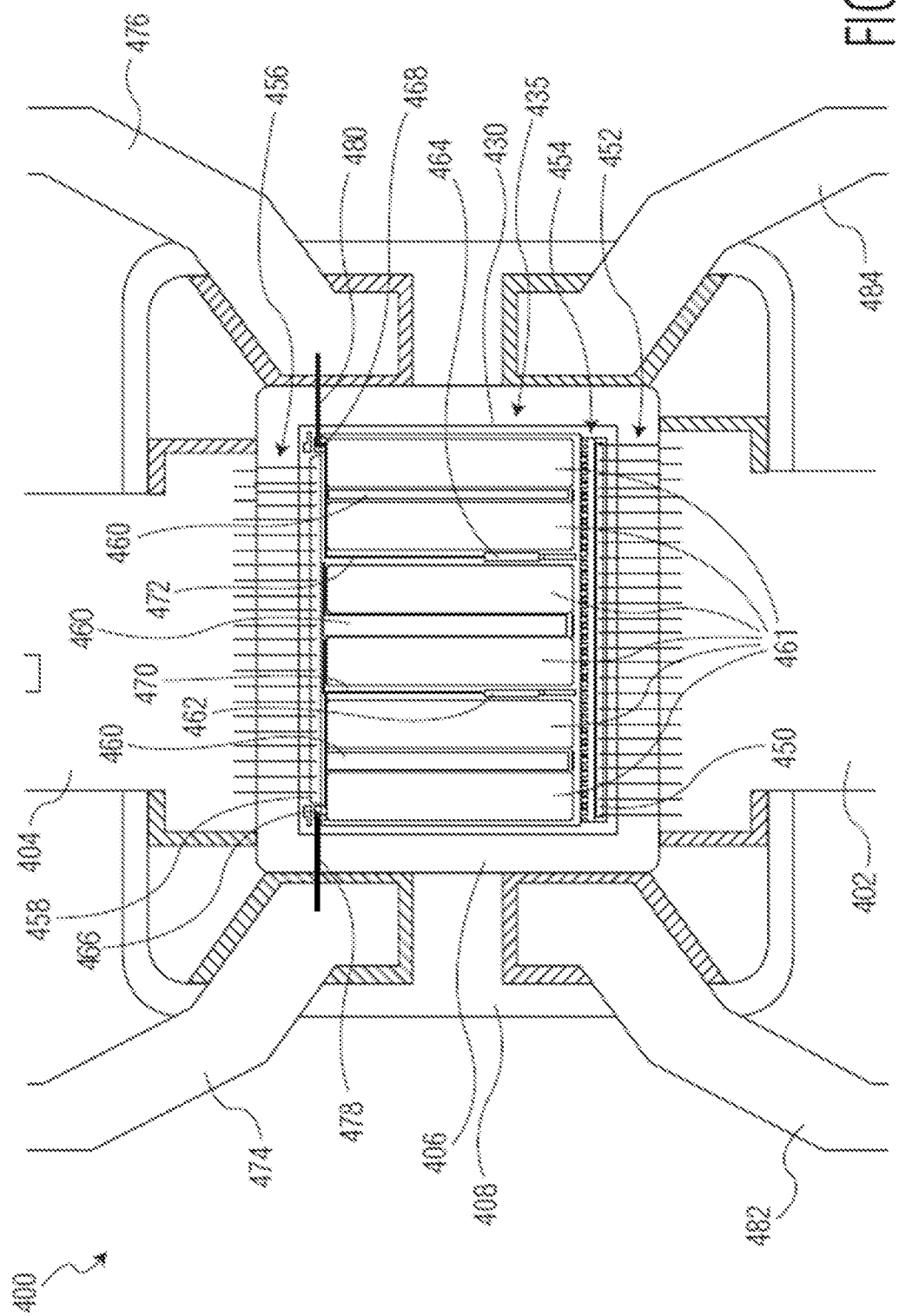
FIG. 4 is a top view of an embodiment of a packaged radio frequency amplifier device that includes a high power transistor and temperature sensor incorporated into a semiconductor die.

FIG. 4 is a top view of an embodiment of a RF amplifier device package 400 that embodies an instance of the semiconductor die 100 of FIG. 1, and which may be utilized to implement a high-power amplifier, as described herein. Although amplifier device 400 is depicted as including only a single instance of semiconductor die 100 of FIG. 1, it should be understood that different implementations of packaged amplifier device 400 may include two or more semiconductor die, each containing circuitry that is the same as or similar to that depicted in FIG. 1. For example, for very high-power applications, 4 or more semiconductor die may be incorporated into a package amplifier device 400 like that shown in FIG. 4, in which each semiconductor die may include a high-power transistor, as shown in semiconductor die 100 of FIG. 1.

Device 400 includes a flange 406 (or "device substrate"), in an embodiment, which includes a rigid electrically-conductive substrate with a thickness that is sufficient to provide structural support for various electrical components and elements of device 400. In addition, flange 406 may function as a heat sink for die 430 and other devices mounted on flange 406. Flange 406 has top and bottom surfaces and a substantially-rectangular perimeter that corresponds to the perimeter of the device 400.

Flange 406 is formed from an electrically conductive material, and may be used to provide a ground reference node for the device 400. For example, various components and elements may have terminals that are electrically coupled to flange 406, and flange 406 may be electrically coupled to a system ground when the device 400 is incorporated into a larger electrical system. At least the top surface of flange 406 is formed from a layer of conductive material, and possibly all of flange 406 is formed from bulk conductive material.

An isolation structure 408 is attached to the top surface of flange 406, in an embodiment. Isolation structure 408, which is formed from a rigid, electrically insulating material, provides electrical isolation between conductive features of the device (e.g., between leads 402, 404 and flange 406). Isolation structure 408 has a frame shape, in an embodiment, which includes a substantially enclosed, four-sided structure with a central opening. Isolation structure 408 may have a substantially rectangular shape, as shown in FIG. 4, or isolation structure 408 may have another shape (e.g., annular ring, oval, and so on).

Semiconductor die 430 (e.g., die 100 of FIG. 1) is positioned on flange 406 of device 400. For example, semiconductor die 430 may be coupled to the top surface of flange 406 using conductive epoxy, solder, solder bumps, sintering, and/or eutectic bonds.

Device 400 houses an amplification path that runs through semiconductor die 430 and the transistor 435 (e.g., transistor 106 of FIG. 1) embodied there. Lead 402 is connected to gate terminal 450 (e.g., gate contact 116 of FIG. 1) of transistor 435 through a number of bond wires 452 and operates as a control terminal for device 400. Bond wire 452 are connected, in turn to ESD devices 454. ESD devices 454 are connected to gate terminals of the various transistor elements of transistor 435 via conductive traces.

The amplification path includes lead 404, which operates as an output for device 400. Output lead 404 is connected by bond wires 456 to drain terminal 458 (e.g., drain contact 114 of FIG. 1) of transistor 435. Drain terminal 458 is connected to the drain terminals of the various transistor elements of transistor 435 via drain contact traces 460.

Although not shown, transistor 435 includes a source terminal on a back surface of die 430. The source terminal is connected to source terminal of the various transistor elements of transistor 435.

In various applications, the amplification path of device 400 may include additional filter or impedance matching circuitry (e.g., between lead 402 and gate terminal 450 of transistor 435 or between lead 404 and drain terminal 458 of transistor 435).

Leads 402 and 404 are mounted on a top surface of the isolation structure 408 on opposed sides of the central opening, and thus leads 402 and 404 are elevated above the top surface of the flange 406, and are electrically isolated from the flange 406. Generally, leads 402 and 404 are oriented to allow for attachment of bond wires between leads 402 and 404 and components and elements within the central opening of isolation structure 408.

Temperature sensors 462 and 464 (e.g., temperature sensors 122 of FIG. 2 or temperature sensor 200 of FIG. 2) are incorporated into semiconductor die 430 between active areas 461 that includes the active elements or fingers (e.g., fingers 109 of FIGS. 1A and 1B) of transistor 435. FIG. 4 is a simplified figure and does not show detail of the individual active element of transistor 435 (e.g., the source and drain regions) that are arranged in the depicted active areas 461 of elements. Temperature sensors 462 and 464 are configured to measure the temperature of die 430 in their respective immediate vicinities and generate an output voltage that is determined by or proportional to that measured temperature. Temperature sensors 462 and 464 may have any configuration suitable for measuring a temperature of semiconductor die 430. In embodiments, temperature sensors 462 and 464 are implemented using components that are fabricated within die 430. For example, each of temperature sensor 462 and 464 may be implemented a series-connected group of polysilicon diodes, in accordance with the embodiment of temperature sensor 200 illustrated in FIGS. 2 and 3 and sensors 122 illustrated in FIG. 1.

Temperature sensors 462 and 464 are connected, respectively, to temperature sensor contact pads 466 and 468 by conductive traces 470 and 472 (e.g., traces 124 of FIG. 1). As depicted, conductive traces 470 and 472 may generally run over the top surface of semiconductor die 430. In some cases, portions of conductive traces 470 and 472 may run below the top surface of die 430 to avoid making contact with other conductive structures formed thereon. For example, conductive traces 470 and 472 may run underneath drain finger contact traces 460 as necessary. In this configuration, the voltage output of temperature sensors 462 and 464 that reflects their sensed temperatures are established and measurable at temperature sensor contact pads 466 and 468 (e.g., contact pads 126 of FIG. 1), respectively.

Device 400 includes external leads 474 and 476. Lead 474 is connected to temperature sensor contact pad 466 by bond wire 478. Lead 476 is connected to temperature sensor contact pad 468 by bond wire 480. External system components can be connected to external leads 474 and/or 476 to measure the voltages generated by temperature sensors 462 and 464, respectively. For example, an external controller may be coupled to leads 474 and 476 and configured to determine, based on the voltage thereof, whether transistor 435 of die 430 is exceeding a predetermined maximum threshold temperature. If so, die 430 may exceed safe temperature levels. In response to making that determination, the controller can take steps to reduce the operating temperature of die 430, for example, by reducing a magnitude of an input signal to transistor 435 or reducing a voltage at lead 402, which in turn will reduce the voltage at gate terminal 450 of transistor 435 and disable operation of transistor 435.

In addition to leads 402 and 404 and external leads 474 and 476, device 400 also may optionally include bias leads 482 and 484. Bias leads 482 and 484 may be electrically coupled through bond wires and other conductors to a control terminal of transistor 435 or to a current conducting terminal (e.g., the drain) of transistor 435 to apply a bias voltage thereto. To generate the bias voltage, bias leads 482 and 484 may be electrically coupled to an external bias circuit (not shown), which provides a bias voltage.

In the example of FIG. 4, device 400 is depicted as including a single transistor die 430, although other embodiment of device 400 may include two transistor die or more than two transistor die, as well. In addition, in certain applications, device 400 may include various additional components (e.g., integrated passive device assemblies) that may function and input and/or output impedance matching devices, filters, or other system components.

According to an embodiment, device 400 is incorporated in an air cavity package, in which transistor die 430, and various other components are located within an enclosed air cavity. Basically, the air cavity is bounded by flange 406, isolation structure 408, and a cap (not shown) overlying and in contact with the isolation structure 408 and leads 402 and 404. In other embodiments, the components of device 400 may be incorporated into an overmolded package (i.e., a package in which the electrical components within the active device area are encapsulated with a non-conductive molding compound, and in which portions of the leads 402 and 404 also may be encompassed by the molding compound). In an overmolded package, isolation structure 408 may be excluded.

FIG. 5 is a block diagram depicting components of a control system 500 configured to monitor an on-die temperature sensor, where the temperature sensor is configured to measure a temperature indicative of an operational temperature of a high-power transistor. System 500 includes a semiconductor die 501 (e.g., die 100 of FIG. 1 or die 430 of FIG. 4). Transistor 502 (e.g., transistor 106 of FIG. 1 or transistor 435 of FIG. 4) is formed within die 501. Transistor 502 includes a number of active elements that are arranged in columns of interdigitated elements. Each active element includes a source, drain, and gate element. The various interdigitated active elements of transistor 502 are connected to various terminals of transistor 502. Specifically, transistor 502 includes a gate terminal 504 (e.g., gate contact 116 of FIG. 1 or gate terminal 450 of FIG. 4), a source terminal 506 (e.g., formed on a back surface of die 501 and connected to ground potential node 508), and a drain terminal 510 (e.g., drain contact 114 of FIG. 1 or drain terminal 458 of FIG. 4). In other configurations, however, transistor 502 may be of a different configuration, depending on the characteristics of the selected substrate and the operation and performance of the transistor. For instances in which transistor 502 is a BJT transistor, gate terminal 504 will be instead be a base terminal, source terminal 506 will instead be an emitter terminal, and drain terminal 510 will instead be a collector terminal.

Die 501 includes temperature sensor 512 (e.g., temperature sensors 122 of FIG. 1, temperature sensor 200 of FIGS. 2 and 3, or temperature sensors 462 and 464 of FIG. 4). Temperature sensor 512 may be implemented using a number of series connected diodes 514 (e.g., polysilicon diodes 202a-202e of FIG. 2). Typically, temperature sensor 512 is located within die 501 in a position such that temperature sensor 512 is exposed to the operational temperature of transistor 502.

To utilize temperature sensor 512, temperature sensor 512 includes a first contact node 516 (e.g., first end 216 of temperature sensor 200 of FIG. 2) connected to constant current source 518. A second contact node 520 (e.g., second end 218 of temperature sensor 200 of FIG. 2) of temperature sensor 512 is connected to ground potential node 508. With a constant current supplied to temperature sensor 512 the voltage drop across temperature sensor 512 (and, specifically, each of diodes 514) is temperature dependent. In an embodiment, as the temperature of the temperature sensor 512 increases, the voltage drop across temperature sensor 512 will decrease, for a given current supplied by constant current source 518.

System 300 includes a comparator 522 having first input 524, second input 526, and an output node 528. The voltage of temperature sensor 512 is supplied as an input to first input 524 of comparator 522 (e.g., via a contact pad 126 of FIG. 2, or contact pad 466 or 468 of FIG. 4). A set voltage 530 is supplied as an input to the second input 526 of comparator 522. The set voltage 530 is set to a predetermined voltage that corresponds the voltage that would be measured by temperature sensor 512 when transistor 502 has reached a maximum allowable operational temperature.

Comparator 522 generates an output signal when the voltage at the first input 524 falls below (i.e., has passed, in a negative direction) the voltage at the second input 526, which indicates that the temperature of temperature sensor 512 is greater than the maximum allowable operational temperature of transistor 502 as established by set voltage 530. The output signal may involve a change on the output signal of comparator 522 (e.g., from a low or negative voltage value to a positive or higher voltage value) or from no output signal to a measurable output signal or vice versa.

The output of comparator 522 is fed back into components that can control or modulate the operation of transistor 502 in response to the output signal. In the Example shown in FIG. 5, the output signal can be fed back into gate bias controller 532. Upon detecting the output signal from comparator 522, gate bias controller 532 may be configured to reduce the gate bias voltage supplied to gate terminal 504 (e.g., via lead 402 of FIG. 4), which can inhibit the operation of transistor 502 (i.e., turn transistor 502 off), resulting in a temperature decrease of transistor 502.

Additionally, the output of comparator 522 can be fed back into signal source 534, which is configured to supply the RF input signal into gate terminal 504 of transistor 502. Upon detecting the output signal from comparator 522, signal source 534 may be configured to reduce a magnitude of the signal being inputted to transistor 502, resulting in a temperature decrease of transistor 502.

As such, comparator 522, in combination with the connections to bias controller 532 and/or signal source 534 operates a control circuit that can operate to control or modulate an operation of transistor 502 (e.g., by reducing a magnitude of an input signal thereto or by inhibiting operation of transistor 502) based upon detecting that the temperature measured by temperature sensor 512 has exceeded a predetermined threshold.

When the temperature of transistor 502 as measured by temperature sensor 512 falls below the predetermined maximum allowable temperature (i.e., the voltage at comparator 522 input 524 becomes greater than the voltage at input 526), gate bias controller 532 and/or signal source 534 can resume normal operations.

In various embodiments of system 500, system 500 may only include a single mechanism for controlling the operation (and temperature) of transistor 502. For example, in applications in which the input signal generated by signal source 534 is of a fixed magnitude (and therefore cannot be reduced), the output signal of comparator 522 may only be supplied to gate bias controller 532 so that when the temperature of transistor 502 exceeds the maximum allowable operational temperature, the gate bias controller 532 turns transistor 502 off until the measured temperature falls below the maximum allowable operational temperature and comparator 522 no longer generates an output signal indicate an overheat condition, and gate bias controller 532 resumes supplying its normal gate bias voltage signal enabling normal operation of transistor 502.

Alternatively, in applications in which a magnitude of the input signal generated by signal source 534 can be modulated, the output signal of comparator 522 may be supplied to signal source 534 enabling the magnitude of the input signal to be reduced when the temperature of transistor 502 exceeds the maximum allowable operational temperature. And when the measured temperature falls below the maximum allowable operational temperature and comparator 522 no longer generates an output signal indicating an overheat condition, signal source 534 may resume supplying the normal input signal to transistor 502.

In various embodiments of system 500, an input matching network 536 may be positioned between signal source 534 and transistor 502 to provide an input impedance matching function between signal source 534 and gate terminal 504. Similarly, an output matching and drain bias network 538 may be coupled to the drain terminal 510 of transistor 502 to provide output impedance matching between drain terminal 510 and a load connected to the output matching network 538. Output matching and drain bias network 538 may also be configured to provide a drain bias voltage to the drain terminal 510 of transistor 502.

In some configurations of system 500 additional system components (not shown) may be coupled to temperature sensor 512 (e.g., at node 516) in order to read the voltage generated by temperature sensor 512, convert that voltage to a measured temperature value, and perform additional system functions based on the measured temperature of temperature 512 and transistor 502.

FIG. 6 is a block diagram depicting components of a system 600 configured to monitor a plurality of on-die temperature sensors that are each configured to measure a temperature indicative of an operational temperature of a high-power transistor. FIG. 6 shows two temperature sensors 612a and 612b, though it should be understood that three or more temperature sensors may be incorporated into semiconductor die 601 in accordance with this disclosure. System 600 may be of a similar configured to system 500 of FIG. 5, but includes an additional temperature sensor.

System 600 includes a semiconductor die 601 (e.g., die 100 of FIG. 1 or die 430 of FIG. 4). Transistor 602 (e.g., transistor 106 of FIG. 1 or transistor 435 of FIG. 4) is formed within die 601. Transistor 602 includes a number of active elements that are arranged in columns of interdigitated elements. Each element of transistor 602 includes a source, drain, and gate element. The various interdigitated elements of transistor 602 are connected to various terminals of transistor 602. Specifically, transistor 602 includes a gate terminal 604 (e.g., gate contact 116 of FIG. 1 or gate terminal 450 of FIG. 4), a source terminal 606 (e.g., formed on a back surface of die 601 and connected to ground potential node 608), and a drain terminal 610 (e.g., drain contact 114 of FIG. 1 or drain terminal 458 of FIG. 4). In other configurations, however, transistor 602 may be of a different configuration, depending on the characteristics of the selected substrate and the operation and performance of the transistor. For instances in which transistor 602 is a BJT transistor, gate terminal 604 will be instead be a base terminal, source terminal 606 will instead be an emitter terminal, and drain terminal 610 will instead be a collector terminal.

Die 601 includes a number of temperature sensors 612a-612b (e.g., temperature sensors 122 of FIG. 1, temperature sensor 200 of FIGS. 2 and 3, or temperature sensors 462 and 464 of FIG. 4). Temperature sensors 612a-612b may be implemented using a number of series connected diodes (e.g., polysilicon diodes 202a-202e of FIG. 2). Typically, temperature sensors 612a-612b are located within die 601 in a position such that temperature sensors 612a-612b are exposed to the operational temperature of transistor 602.

To utilize temperature sensors 612a-612b, temperature sensors 612a-612b are connected in parallel between constant current source 618 and ground potential node 608. With a constant current supplied to temperature sensors 612a-612b the voltage drop across each of temperature sensors 612a-612b (and, specifically, each of the diodes making up each temperature sensor 612a and 612b) is temperature dependent. In an embodiment, as the temperature of either of temperature sensor 612a or 612b increases, the voltage drop across the respective temperature sensor 612a or 612b will decrease, for a given current supplied by constant current source 618.

System 600 includes a comparator 622 having first input 624, second input 626, and an output node 628. The voltage of temperature sensor 612 is supplied as an input to first input 624 of comparator 622 (e.g., via a contact pad 126 of FIG. 1 or contact pads 466 or 468 of FIG. 4). A set voltage 630 is supplied as an input to the second input 626 of comparator 622. The set voltage 630 is set to a predetermined voltage that corresponds the voltage that would be measured by either of temperature sensor 612a or 612b when transistor 602 has reached a maximum allowable operational temperature.

Comparator 622 generates an output signal when the voltage at the first input 624 falls below (i.e., has passed, in a negative direction) the voltage at the second input 626. Because temperature sensors 612a and 612b are connected to first input 624 in parallel, the voltage at first input 624 will be equal to the lower of the voltages across temperature sensor 612 and 612b. If the voltage at first input 624 falls below the voltage at the second input 626, which indicates that the temperature of either temperature sensor 612a or 612b is greater than the maximum allowable operational temperature of transistor 602 as established by set voltage 630. The output signal may involve a change on the output signal of comparator 622 (e.g., from a low or negative voltage value to a positive or higher voltage value) or from no output signal to a measurable output signal or vice versa.

The output of comparator 622 is fed back into components that can control or modulate the operation of transistor 602 in response to the output signal. In the Example shown in FIG. 6, the output signal can be fed back into gate bias controller 632. Upon detecting the output signal from comparator 622, gate bias controller 632 may be configured to reduce the gate bias signal supplied to gate terminal 604, which can inhibit the operation of transistor 602, resulting in a temperature decrease of transistor 602.

Additionally, the output of comparator 622 is fed back into signal source 634, which is configured to supply the RF input signal into gate terminal 604 of transistor 602. Upon detecting the output signal from comparator 622, signal source 634 may be configured to reduce a magnitude of or otherwise interrupt the signal being inputted to transistor 602, resulting in a temperature decrease of transistor 602.

As such, comparator 622, in combination with the connections to bias controller 632 and/or signal source 634 operates a control circuit that can operate to control or modulate an operation of transistor 602 (e.g., by reducing a magnitude of an input signal thereto or by inhibiting operation of transistor 602) based upon detecting that the temperature measured by temperature sensor 612a or 612b has exceeded a predetermined threshold.

When the temperature of transistor 602 as measured by both temperature sensors 612a and 612b falls below the predetermined maximum allowable temperature (i.e., the voltage at comparator 622 input 624 becomes greater than the voltage at input 626), gate bias controller 632 and/or signal source 634 can resume normal operations.

In various embodiments of system 600, system 600 may only include a single mechanism for controlling the operation (and temperature) of transistor 602. For example, in applications in which the input signal generated by signal source 634 is of a fixed magnitude (and therefore cannot be reduced), the output signal of comparator 622 may only be supplied to gate bias controller 632 so that when the temperature of transistor 602 exceeds the maximum allowable operational temperature, the gate bias controller 632 turns transistor 602 off until the measured temperature falls below the maximum allowable operational temperature and comparator 622 no longer generates an output signal indicate an overheat condition, and gate bias controller 632 resumes supplying its normal gate bias voltage signal enabling normal operation of transistor 602.

Alternatively, in application in which a magnitude of the input signal generated by signal source 634 can be modulated, the output signal of comparator 622 may be supplied to signal source 634 enabling the magnitude of the input signal to be reduced when the temperature of transistor 602 exceeds the maximum allowable operational temperature. And when the measured temperature falls below the maximum allowable operational temperature and comparator 622 no longer generates an output signal indicating an overheat condition, signal source 634 may resume supplying the normal input signal to transistor 602.

In various embodiments of system 600, an input matching network 636 may be positioned between signal source 634 and transistor 602 to provide an input impedance matching function between signal source 634 and gate terminal 604. Similarly, an output matching and drain bias network 638 may be coupled to the drain terminal 610 of transistor 602 to provide output impedance matching between drain terminal 610 and a load connected to the output matching network 638. Output matching and drain bias network 638 may also be configured to provide a drain bias voltage to the drain terminal 610 of transistor 602.

In some configurations of system 600 additional system components (not shown) may be coupled to one or more of temperature sensors 612a or 612b (e.g., at node 516) in order to read the voltage generated by temperature sensors 612a or 612b, convert that voltage to a measured temperature value, and perform additional system functions based on the measured temperature of transistor 602.

The preceding detailed description is merely illustrative in nature and is not intended to limit the embodiments of the subject matter or the application and uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, or detailed description.

It should be understood that this invention is not limited in its application to the details of construction and the arrangement of components set forth in the preceding description or illustrated in the accompanying drawings. The invention is capable of other embodiments and of being practiced or of being carried out in various ways. Also, it is to be understood that the phraseology and terminology used herein is for the purpose of description and should not be regarded as limiting. The use of "including," "comprising," or "having" and variations thereof herein is meant to encompass the items listed thereafter and equivalents thereof as well as additional items. Unless specified or limited otherwise, the terms "mounted," "connected," "supported," and "coupled" and variations thereof are used broadly and encompass both direct and indirect mountings, connections, supports, and couplings. Further, "connected" and "coupled" are not restricted to physical or mechanical connections or couplings.

The preceding discussion is presented to enable a person skilled in the art to make and use embodiments of the invention. Various modifications to the illustrated embodiments will be readily apparent to those skilled in the art, and the generic principles herein can be applied to other embodiments and applications without departing from embodiments of the invention. Thus, embodiments of the invention are not intended to be limited to embodiments shown, but are to be accorded the widest scope consistent with the principles and features disclosed herein. The preceding detailed description is to be read with reference to the figures, in which like elements in different figures have like reference numerals. The figures, which are not necessarily to scale, depict selected embodiments and are not intended to limit the scope of embodiments of the invention. Skilled artisans will recognize the examples provided herein have many useful alternatives and fall within the scope of embodiments of the invention.

The connecting lines shown in the various figures contained herein are intended to represent exemplary functional relationships and/or physical couplings between the various elements. It should be noted that many alternative or additional functional relationships or physical connections may be present in an embodiment of the subject matter. In addition, certain terminology may also be used herein for the purpose of reference only, and thus are not intended to be limiting, and the terms "first", "second" and other such numerical terms referring to structures do not imply a sequence or order unless clearly indicated by the context.

As used herein, a "node" means any internal or external reference point, connection point, junction, signal line, conductive element, or the like, at which a given signal, logic level, voltage, data pattern, current, or quantity is present. Furthermore, two or more nodes may be realized by one physical element (and two or more signals can be multiplexed, modulated, or otherwise distinguished even though received or output at a common node).

The foregoing description refers to elements or nodes or features being "connected" or "coupled" together. As used herein, unless expressly stated otherwise, "connected" means that one element is directly joined to (or directly communicates with) another element, and not necessarily mechanically. Likewise, unless expressly stated otherwise, "coupled" means that one element is directly or indirectly joined to (or directly or indirectly communicates with, electrically or otherwise) another element, and not necessarily mechanically. Thus, although the schematic shown in the figures depict one exemplary arrangement of elements, additional intervening elements, devices, features, or components may be present in an embodiment of the depicted subject matter.

In accordance with an embodiment, a system includes a semiconductor die including a transistor formed in an active area of the semiconductor die, the transistor including an output terminal and a control terminal, a first temperature sensor contact pad, and a first temperature sensor. A first portion of the active area is on a first side of the first temperature sensor and a second portion of the active area is on a second side of the first temperature sensor opposite the first side. The first temperature sensor is between the control terminal and the output terminal. The first temperature sensor is coupled to the first temperature sensor contact pad. The first temperature sensor is configured to generate a first output signal at the first temperature sensor contact pad. A magnitude of the first output signal is proportional to a temperature of the first temperature sensor. The system includes a control circuit coupled to the first temperature sensor contact pad. The control circuit is configured to determine that a magnitude of the first output signal of the first temperature sensor has passed a threshold, and, in response to determining the magnitude of the first output signal of the first temperature sensor has passed the threshold, modify an operation of the transistor.

In another embodiment, a device includes a semiconductor die including a transistor. The transistor includes a plurality of parallel transistor elements. Each transistor element includes a drain region, a source region, and a gate region. The semiconductor die includes a first temperature sensor between a first transistor element in the plurality of transistor elements and a second transistor element in the plurality of transistor elements. The first temperature sensor is configured to generate a first output signal having a magnitude that is proportional to a temperature of the first temperature sensor.

In another embodiment, a radio frequency (RF) amplifier device includes a device package including at least a first package lead, a second package lead, and a third package lead. The device package encases a semiconductor die, including a transistor, and a first temperature sensor that is coupled to the third package lead. The first temperature sensor is configured to generate a first output signal at the third package lead. A magnitude of the first output signal is proportional to a temperature of the first temperature sensor.

While at least one exemplary embodiment has been presented in the foregoing detailed description, it should be appreciated that a vast number of variations exist. It should also be appreciated that the exemplary embodiment or embodiments described herein are not intended to limit the scope, applicability, or configuration of the claimed subject matter in any way. Rather, the foregoing detailed description will provide those skilled in the art with a convenient road map for implementing the described embodiment or embodiments. It should be understood that various changes can be made in the function and arrangement of elements without departing from the scope defined by the claims, which includes known equivalents and foreseeable equivalents at the time of filing this patent application.

What is claimed is:

1. A system, comprising:
   a semiconductor die, including:
      a transistor formed in an active area of the semiconductor die, the transistor including an output terminal and a control terminal,
      a first temperature sensor contact pad, and
      a first temperature sensor, wherein a first portion of the active area is on a first side of the first temperature sensor and a second portion of the active area is on a second side of the first temperature sensor opposite the first side, the first temperature sensor is between the control terminal and the output terminal, the first temperature sensor is coupled to the first temperature sensor contact pad, and the first temperature sensor is configured to generate a first output signal at the first temperature sensor contact pad, wherein a magnitude of the first output signal is proportional to a temperature of the first temperature sensor; and
   a control circuit coupled to the first temperature sensor contact pad, wherein the control circuit is configured to:
      determine that a magnitude of the first output signal of the first temperature sensor has passed a threshold, and
      in response to determining the magnitude of the first output signal of the first temperature sensor has passed the threshold, modify an operation of the transistor.

2. The system of claim 1, wherein the transistor includes a plurality of drain regions coupled to the output terminal of the transistor and a plurality of gates coupled to the control terminal of the transistor.

3. The system of claim 2, wherein the plurality of drain regions and the gates are arranged in a plurality of transistor elements, and the first temperature sensor is between a first transistor element of the plurality of transistor elements and a second transistor element of the plurality of transistor elements.

4. The system of claim 3, wherein the semiconductor die includes a second temperature sensor contact pad and a second temperature sensor coupled to the second temperature sensor contact pad, wherein the second temperature sensor is between the second transistor element of the plurality of transistor elements and a third transistor element of the plurality of transistor elements.

5. The system of claim 4, wherein the second temperature sensor is configured to generate a second output signal at the second temperature sensor contact pad, wherein the second output signal is proportional to a temperature of the second temperature sensor and the control circuit is configured to modify the operation of the transistor when a magnitude of the second output signal of the second temperature sensor has passed the threshold.

6. The system of claim 2, further comprising a signal source coupled to the control terminal, wherein the signal source is configured to supply an input signal to the control terminal of the transistor and the control circuit is configured to modify an operation of the transistor by causing the signal source to reduce a magnitude of the input signal.

7. The system of claim 2, further comprising a gate bias controller coupled to the control terminal, wherein the gate bias controller is configured to supply a gate bias voltage to the control terminal of the transistor and the control circuit is configured to modify an operation of the transistor by causing the gate bias controller to reduce a magnitude of the gate bias voltage.

8. The system of claim 1, wherein the first temperature sensor includes at least one polysilicon diode.

9. The system of claim 8, wherein the at least one polysilicon diode includes a plurality of regions of a first doping type and a plurality of regions of a second doping type, and the plurality of regions of the first doping type are interdigitated with the plurality of regions of the second doping type.

10. A device, comprising:
    a semiconductor die including:
       a gate terminal,
       a drain terminal,
       a transistor positioned within an active region between the gate terminal and the drain terminal, the transistor including parallel first and second transistor elements, wherein the first transistor element includes a first drain region electrically coupled to the drain terminal, a first source region, and a first gate region electrically coupled to the gate terminal, and wherein the second transistor element includes a second drain region electrically coupled to the drain terminal, a second source region, and a second gate region electrically coupled to the gate terminal, and
       a first temperature sensor integrated within the semiconductor die and positioned within the active region between the first transistor element and the second transistor element, and between the gate terminal and the drain terminal, wherein the first temperature sensor is configured to generate a first output signal having a magnitude that is proportional to a temperature of the first temperature sensor.

11. The device of claim 10, wherein the first temperature sensor includes at least one polysilicon diode.

12. A device, comprising:
a semiconductor die, including:
a transistor, the transistor including a plurality of parallel transistor elements, wherein each transistor element includes a drain region, a source region, and a gate region, and
a first temperature sensor between a first transistor element in the plurality of transistor elements and a second transistor element in the plurality of transistor elements, wherein the first temperature sensor is configured to generate a first output signal having a magnitude that is proportional to a temperature of the first temperature sensor, wherein the first temperature sensor includes at least one polysilicon diode, and wherein the at least one polysilicon diode includes a plurality of regions of a first doping type and a plurality of regions of a second doping type and the plurality of regions of the first doping type are interdigitated with the plurality of regions of the second doping type.

13. The device of claim 10, wherein the semiconductor die includes a second temperature sensor between the second transistor element of the plurality of transistor elements and a third transistor element of the plurality of transistor elements, and wherein the second temperature sensor is configured to generate a second output signal having a magnitude that is proportional to a temperature of the second temperature sensor.

14. The device of claim 10, further comprising a control circuit configured to modify an operation of the transistor when the magnitude of the first output signal passes a threshold.

15. The device of claim 14, wherein the control circuit is configured to modify the operation of the transistor by reducing a magnitude of an input signal to the transistor or inhibiting an operation of the transistor.

16. A radio frequency (RF) amplifier device, comprising:
a device package including at least a first package lead, a second package lead, and a third package lead, the device package encasing:
a semiconductor die including:
a gate terminal,
a drain terminal,
a transistor positioned within an active region between the gate terminal and the drain terminal, the transistor including parallel first and second transistor elements, wherein the first transistor element includes a first drain region electrically coupled to the drain terminal, a first source region, and a first gate region electrically coupled to the gate terminal, and wherein the second transistor element includes a second drain region electrically coupled to the drain terminal, a second source region, and a second gate region electrically coupled to the gate terminal, and
a first temperature sensor that is coupled to the third package lead, wherein the first temperature sensor is integrated within the semiconductor die and positioned within the active region between the first transistor element and the second transistor element, and between the gate terminal and the drain terminal, and wherein the first temperature sensor is configured to generate a first output signal at the third package lead, wherein a magnitude of the first output signal is dependent on a temperature sensed by the first temperature sensor.

17. The RF amplifier device of claim 16, wherein the device package includes a fourth package lead, and the semiconductor die includes a second temperature sensor that is coupled to the fourth package lead, wherein the second temperature sensor is between the second transistor element and a third transistor element.

18. The RF amplifier device of claim 16, wherein the first temperature sensor includes at least one polysilicon diode.

19. The RF amplifier device of claim 18, wherein the at least one polysilicon diode includes a plurality of regions of a first doping type and a plurality of regions of a second doping type and the plurality of regions of the first doping type are interdigitated with the plurality of regions of the second doping type.

20. The device of claim 10, wherein the semiconductor die further comprises:
a first temperature sensor contact pad configured to be connected to external circuit components; and
a conductive structure connecting the first temperature sensor and the first temperature sensor contact pad.

21. The device of claim 20, wherein the conductive structure connecting the first temperature sensor and the first temperature sensor contact pad comprises a trace extending between the first and second transistor elements, and wherein the trace is configured not to come into contact with the drain terminal.

22. The device of claim 20, wherein:
the first temperature sensor has a first end and a second end,
the first end is connected through the conductive structure to the first temperature sensor contact pad, and
the second end is connected to a ground potential node.

23. The device of claim 10, wherein the first output signal is a voltage signal that is indicative of the temperature.

24. The device of claim 10, wherein the magnitude of the first output signal is dependent on the temperature sensed by the first temperature sensor when a constant current is supplied to the first temperature sensor.

* * * * *